United States Patent [19]

Seino

[11] Patent Number: 5,698,377

[45] Date of Patent: Dec. 16, 1997

[54] METHOD OF FORMING A RESIST PATTERN

[75] Inventor: Tatsuya Seino, Tochigi-ken, Japan

[73] Assignee: Nippon Precision Circuits Inc., Tokyo, Japan

[21] Appl. No.: 661,577

[22] Filed: Jun. 11, 1996

[30] Foreign Application Priority Data

Jun. 13, 1995 [JP] Japan .................... 7-146367

[51] Int. Cl.[6] .................................................... G03F 7/20
[52] U.S. Cl. ........................... 430/325; 430/328; 430/394
[58] Field of Search ................................. 430/322, 325, 430/328, 394, 396

[56] References Cited

U.S. PATENT DOCUMENTS

| 5,238,811 | 8/1993 | Fujiwara | 430/394 |
| 5,524,784 | 6/1996 | Shiba | 430/394 |

FOREIGN PATENT DOCUMENTS

| 58-200534 | 11/1983 | Japan | 430/328 |
| 1-140145 | 6/1989 | Japan | 430/328 |
| 5-80534 | 4/1993 | Japan | 430/328 |

*Primary Examiner*—Kathleen Duda
*Attorney, Agent, or Firm*—Jordan and Hamburg

[57] ABSTRACT

To provide a method of forming a resist pattern in a readily controllable manner and at low costs, in a first exposure step, a resist layer is subject to exposure through a mask. In the next, first developing step, a stepped portion 4 is formed in the resist layer. In a second exposure step, the resist layer is again subject to exposure. At this time, phase shift by 180° occurs in the stepped portion so as to allow some area of the resist layer along the step to be not subject to exposure. In the second developing step, the exposed area of the resist layer 2 is removed to form a resist pattern along the step. Accordingly, the present invention is less subject to diffraction than the case where a phase shifter is employed, and is able to form a resist pattern in a readily controllable manner and reduce fabrication costs.

4 Claims, 2 Drawing Sheets

METHOD OF FORMING A RESIST PATTERN

BACKGROUND

The present invention relates to a method of forming a resist pattern.

To improve obtainable complexity of a resist pattern, a conventional method of forming a resist pattern involves a reduction in the wavelength of a light and a change in exposure systems in a photolithographic process or employs a phase shift, a multi-layer resist, a surface pattern imaging or the like.

However, such attempts result in complication of fabrication steps and increased fabrication costs. Particularly, the phase shift requires the manufacture and maintenance of masks or even the manufacture of a special mask. The phase shift is also disadvantageous since it is difficult to form a resist pattern in a controllable manner due to diffraction.

It is therefore an object of the present invention to provide a method of forming a resist pattern which is able to form a resist pattern in a readily controllable manner and at low costs.

SUMMARY

The foregoing object is met by providing a method of forming a resist pattern which comprises a first exposure step for selectively exposing a resist layer to light through a mask having a predetermined pattern, a first developing step for developing the resist layer after the first exposure step so as to form a stepped portion of a given thickness in the resist layer, a second exposure step for exposing the resist layer to a light after the first developing step to cause phase shift by 180° in the stepped portion, and a second developing step for developing the resist layer so as to form a resist pattern along the step.

The given thickness is preferably such that the difference in optical path length between the interior and exterior of the resist layer at the given thickness is an odd number times a value of half of the wavelength of a light used in the second exposure step multiplied by a factor of odd numbers.

DETAILED DESCRIPTION OF THE INVENTION

Reference will now be made to a method of forming a resist pattern according to one embodiment of the present invention. FIGS. 1A to 1D illustrate a sequence of fabrication steps involved in this embodiment. Referring to these drawing figures, the embodiment will be described in accordance with its fabrication order.

Figure 1A:
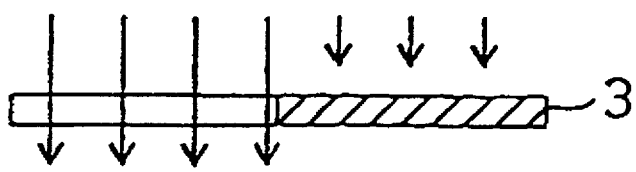
FIGS. 1A to 1D illustrate a sequence of fabrication steps involved in a method of forming a resist pattern according to one embodiment of the present invention.

Firstly, a first exposure step takes place as shown in FIG. 1A. A resist layer 2 is formed on a wafer 1 and selectively exposed to light through a mask 3. The mask 3 has a predetermined pattern. The amount of the light is such that the exposed area of the resist layer 2 does not disappear during the following developing step.

Figure 1B:
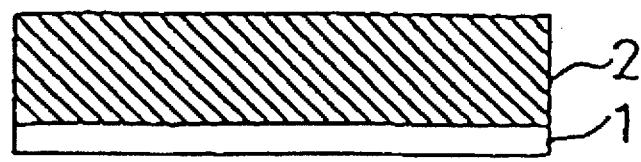

Next, a first developing step takes place. The exposed area of the resist layer 2 is removed so as to form a stepped portion 4 in the resist layer 2 as shown in FIG. 1B. The next process is to effect baking by the use of a hot plate although it may not be necessary depending on the types of resist layers 2.

Figure 1C:
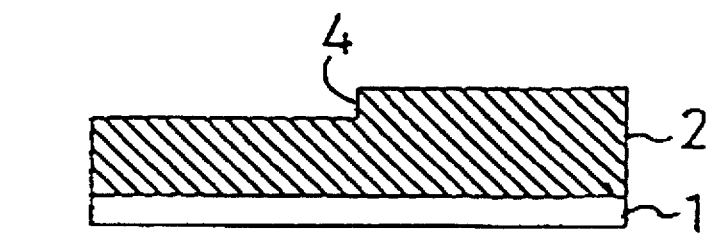
Figure 2A:
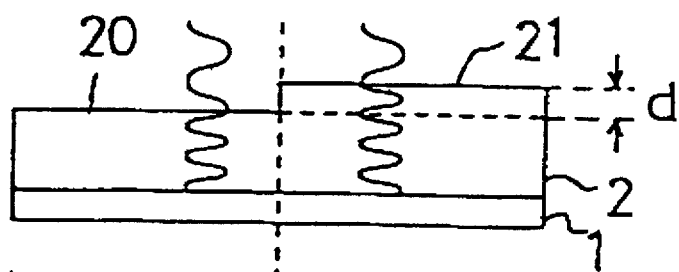
FIGS. 2A to 2C illustrate FIGS. 1A to 1D in more detail.
Figure 2B:
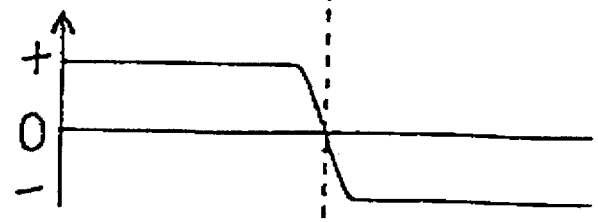
Figure 2C:
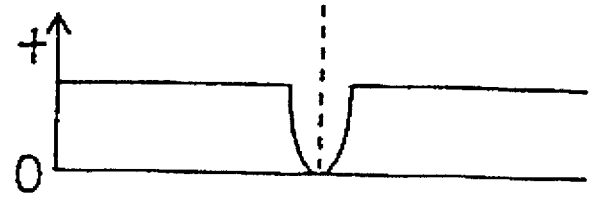

Next, a second exposure step takes place. In this step, the entire surface of the resist layer 2 is exposed to light with a single wavelength, such as g-ray or i-ray, without using the mask as shown in FIG. 1C. FIG. 2A schematically shows the phase of a light used in the second exposure step. There is a difference in phase between the interior and exterior of the resist layer 2 through the stepped portion 4. In this embodiment, the thickness of the stepped portion 4 is such that the difference in optical path length between the interior and exterior of the resist layer 2 at the thickness is an odd number times a value of half of the wavelength of a light used in the second exposure step multiplied by a factor of odd numbers. This is represented by the following relationship: $2d(n1-n2)=l(2n-1)$, where n1 is the refractive index of the light within the resist layer, n2 ($<$n1) is the refractive index of the light outside of the resist layer, $\lambda$, is the wavelength of the light (in a vacuum) used in the second exposure step, d is the thickness of the stepped portion 4, and n is an integer and is at least one. In the stepped portion 4, the phase of a light passing through a thin portion 20 of the resist layer 2 is offset by 180° from the phase of a light passing through a thick portion 21 of the resist layer 2. Where, for example, g-rays ($\lambda=0.436$ μm) are used to expose and in the air, the refractive index n2 of the exterior of the resist layer 2 is set at substantially 1 as in a vacuum. The refractive index n1 of the resist layer 2 is set at 1.6. The thickness, d, of the stepped portion 4 is set at approximately 0.4 μm. With this, light interference occurs in the boundary between the thin portion 20 and the thick portion 21. FIGS. 2B and 2C show the relationship between the position of the light within the resist layer 2 and the amplitude and intensity of the light. Under the circumstances, some area of the resist layer 2 along the step is not subject to exposure. The range of the nonexposed area depends on the amount of light. Next, the baking again takes place by the use of a hot plate.

Figure 1D:

Fourthly, a second developing step takes place. A resist pattern appears as shown in FIG. 1D after the exposed area of the resist layer 2 has been removed.

As thus far described, the resist layer 2 functions as a phase shifter. Thus, this embodiment is less subject to diffraction than a conventional phase shifter and is able to form a resist pattern in a highly controllable manner. Also, this embodiment eliminates the need for a special phase shifter and thus reduces fabrication costs.

According to the present invention, a method of forming a resist pattern includes forming of a step in the resist layer so as to offset phases. This reduces light diffraction and eliminates the need for a phase mask. It is thus possible to form a resist pattern in a readily controllable manner and reduce the fabrication costs.

What is claimed is:

1. A method of forming a resist pattern comprising:
   a first exposure step of selectively exposing a resist layer to a first light through a mask, said mask having a predetermined pattern;
   a first developing step of developing said resist layer after said first exposure step so as to form a thicker portion and a thinner portion in said resist layer which form a stepped portion, the stepped portion having a thickness defined by a distance between a top surface of said thicker portion and a top surface of said thinner portion;
   a second exposure step comprising blanket exposing said resist layer to a second light after said first developing step, wherein said second light has a wavelength such that said thickness of said stepped portion is an odd multiple of half of said wavelength of said second light thereby resulting in a portion of said resist layer which is at the interface between said thinner portion and said thicker portion remaining unexposed; and a second developing step comprising removing said resist layer except for the unexposed portion of said resist layer which remains as the resist pattern.

2. A method of forming a resist pattern as recited in claim 1, wherein the relationship $$2d(n1-n2)=\lambda(2n-1)$$

is satisfied where d is said thickness of said stepped portion, $\lambda$ is said wavelength in a vacuum of said second light used in said second exposure step, n1 and n2 are respectively a refractive index of said second light outside and inside said resist layer, and n represents an integer.

3. A method of forming a resist pattern as recited in claim 1, wherein:

after said first developing step, said resist layer comprises a base layer which is defined by said thinner portion and a lateral extension of said thinner portion into said thicker portion and an upper layer which comprises said thicker portion exclusive of said base layer; and a portion of said second light entering the top surface of said thicker portion and a portion of said second light entering the top surface of said thinner portion results in light interference in a portion of said base layer which is at the interface between said thinner portion and said thicker portion due to phase shift of said portion of said second light passing through said upper layer which leaves unexposed said portion of said base layer at the interface between said thicker portion and said thinner portion.

4. A method for forming a resist pattern comprising:

performing a first exposure step for selectively exposing a resist layer to a first light through a mask, said mask having a predetermined pattern;

performing a first developing step for developing said resist layer after said first exposure step so as to form a stepped portion in said resist layer corresponding to the predetermined pattern, whereby a thicker portion and a thinner portion are formed in the resist layer, the resist layer comprising a base layer and an upper layer, where said base layer of said resist layer is defined by said thinner portion and a lateral extension of said thinner portion into said thicker portion and said upper layer of said resist layer is defined by said thicker portion exclusive of said base layer;

performing a second exposure for blanket exposing said resist layer to a second light in an area of said predetermined pattern after said first developing step, wherein said second light has a wavelength such that the thickness of the upper layer is an odd number multiple of a half of said wavelength of said second light in said resist layer and whereby the relationship $$2d(n1-n2)=\lambda(2n-1)$$

is satisfied where d is the thickness of the upper layer, $\lambda$ is said wavelength in a vacuum of said second light used in said second exposure step, n1 and n2 are respectively a refractive index of said second light outside and inside said resist layer, and n represents an integer thereby resulting in a portion of said base layer remaining unexposed due to a portion of said second light entering the top surface of the thicker portion interfering with a portion of said second light entering the top surface of said thinner portion due to phase shift of said portion of said second light passing through said upper layer relative to said portion of said second light entering through the top surface of said thinner portion; and a second developing step for removing said resist layer except for the portion of said base layer remaining unexposed after the second exposure step which remains as a resist pattern.

* * * * *